US009780736B1

(12) United States Patent
Fronczak et al.

(10) Patent No.: US 9,780,736 B1
(45) Date of Patent: Oct. 3, 2017

(54) TEMPERATURE COMPENSATED OFFSET CANCELLATION FOR HIGH-SPEED AMPLIFIERS

(71) Applicant: SYNAPTICS INCORPORATED, San Jose, CA (US)

(72) Inventors: Kevin Fronczak, Penfield, NY (US); Murat Ozbas, Rochester, NY (US); Yonggang Chen, Shenzhen (CN)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/085,889

(22) Filed: Mar. 30, 2016

(51) Int. Cl.
*H03F 3/45* (2006.01)
*H03F 1/30* (2006.01)

(52) U.S. Cl.
CPC ........... *H03F 1/30* (2013.01); *H03F 3/45071* (2013.01); *H03F 2200/375* (2013.01); *H03F 2203/45286* (2013.01); *H03F 2203/45288* (2013.01)

(58) Field of Classification Search
CPC ....................................................... H03F 3/45
USPC ............................................ 330/257, 289, 9
See application file for complete search history.

(56) References Cited

U.S. PATENT DOCUMENTS

| 5,200,654 | A | | 4/1993 | Archer |
| 5,386,160 | A | | 1/1995 | Archer et al. |
| 5,563,587 | A | | 10/1996 | Harjani |
| 6,020,792 | A | | 2/2000 | Nolan et al. |
| 6,078,208 | A | * | 6/2000 | Nolan ........................ G01K 7/01 327/512 |
| 6,356,161 | B1 | | 3/2002 | Nolan et al. |
| 6,492,874 | B1 | * | 12/2002 | Shih ........................ H03F 1/301 330/288 |
| 6,891,358 | B2 | | 5/2005 | Marinca |
| 7,010,440 | B1 | * | 3/2006 | Lillis ........................ G01K 7/01 327/512 |
| 7,196,577 | B2 | * | 3/2007 | Brunner ..................... H03F 1/34 330/254 |
| 7,317,356 | B2 | * | 1/2008 | Ananth ...................... H03F 1/26 330/253 |
| 7,415,253 | B2 | | 8/2008 | Carter et al. |
| 8,514,020 | B2 | | 8/2013 | Collins et al. |

(Continued)

FOREIGN PATENT DOCUMENTS

| EP | 0944169 A2 | 9/1999 |
| WO | 0036745 A1 | 6/2000 |
| WO | 2004061542 A1 | 7/2004 |

OTHER PUBLICATIONS

Marcel J.M. Pelgrom, et. al, "Matching Properties of MOS Transistors" in IEEE Journal of Solid-State Circuits, vol. 24, No. 5, pp. 1433-1440, Oct. 1989.

(Continued)

*Primary Examiner* — Henry Choe
(74) *Attorney, Agent, or Firm* — Patterson + Sheridan, LLP

(57) ABSTRACT

An apparatus, system, and method are disclosed for compensating input offset of an amplifier having first and second amplifier output nodes. The method comprises generating a proportional-to-absolute temperature (PTAT) current, generating a complementary-to-absolute temperature (CTAT) current, and selecting, based on the input offset, one of the first and second amplifier output nodes into which a compensation current is to be coupled. The compensation current is based on a selected one of the PTAT current and CTAT current.

14 Claims, 6 Drawing Sheets

(56) References Cited

U.S. PATENT DOCUMENTS

| | | | |
|---|---|---|---|
| 9,136,809 B2* | 9/2015 | McMorrow | H03F 1/0261 |
| 2004/0124822 A1 | 7/2004 | Marinca | |
| 2007/0080740 A1 | 4/2007 | Berens et al. | |
| 2010/0301832 A1 | 12/2010 | Katyal et al. | |
| 2014/0152390 A1* | 6/2014 | McMorrow | H03F 1/0261 |
| | | | 330/295 |
| 2016/0258819 A1* | 9/2016 | Xia | G01K 7/01 |

OTHER PUBLICATIONS

Pietro Andricciola and Hans P. Tuinhout, "The Temperature Dependence of Mismatch in Deep-Submicrometer Bulk MOSFETs" in IEEE Electron Device Letters, vol. 30, No. 6, pp. 690-692, Jun. 2009.
S. Mennillo, et. al, "An Analysis of Temperature Impact on MOSFET Mismatch" in IEEE International Conference on Microelectronic Test Structures, Oxford, CA, pp. 56-61, Mar. 2009.

* cited by examiner

TEMPERATURE COMPENSATED OFFSET CANCELLATION FOR HIGH-SPEED AMPLIFIERS

BACKGROUND

Field

Embodiments of the present invention generally relate to techniques for temperature-compensated offset cancellation for high-speed amplifier circuits.

Description of the Related Art

Within an amplifier, input offset voltage is a parameter defining a differential direct current (DC) voltage required between the inputs of the amplifier to make the output voltage zero. However, the input offset voltage value tends to drift with temperature or other conditions.

For amplifiers used within high-speed applications such as serial display links, the input offset voltage can cause a degradation of the output duty cycle (called "duty-cycle distortion" or DCD). DCD can cause display data to be missed or misinterpreted, which directly degrades display performance (e.g., displaying jittery images, incorrect pixels, etc.). One technique for mitigating DCD includes screening the silicon during the manufacturing process, and discarding dies that exhibit unacceptably large offsets. However, this technique tends to reduce yield and increase production costs.

Another technique for mitigating DCD includes adding offset cancellation circuitry to the amplifiers. However, conventional offset cancellation circuitry may exhibit a temperature dependence. Further, offset cancellation circuitry that includes switching elements and/or capacitors can introduce distortion and jitter if the switching events do not occur at a frequency much greater than the amplifier's bandwidth. Naturally, the added distortion and/or jitter may degrade the amplifier's high-frequency performance.

SUMMARY

One embodiment described herein is an apparatus for compensating input offset for an amplifier having first and second amplifier output nodes. The apparatus comprises a proportional-to-absolute temperature (PTAT) current generator configured to generate a PTAT current within a predetermined temperature range, and a complementary-to-absolute-temperature (CTAT) current generator configured to generate a CTAT current within the predetermined temperature range. The apparatus further includes a current selector coupled with the first and second amplifier output nodes and configured to couple, based on the input offset, a compensation current into a selected node of the first and second amplifier output nodes. The compensation current is based on a selected one of the PTAT current and CTAT current.

Another embodiment described herein is a system comprising an amplifier circuit comprising at least one amplifier having first and second amplifier output nodes, and a compensation circuit configured to compensate an input offset of the at least one amplifier. The compensation circuit comprises a proportional-to-absolute temperature (PTAT) current generator configured to generate a PTAT current within a predetermined temperature range, and a complementary-to-absolute-temperature (CTAT) current generator configured to generate a CTAT current within the predetermined temperature range. The compensation circuit further comprises a current selector coupled with the first and second amplifier output nodes and configured to couple, based on the input offset, a compensation current into a selected node of the first and second amplifier output nodes. The compensation current is based on a selected one of the PTAT current and CTAT current.

Another embodiment described herein is a method for compensating input offset of an amplifier having first and second amplifier output nodes. The method comprises generating a proportional-to-absolute temperature (PTAT) current, generating a complementary-to-absolute temperature (CTAT) current, and selecting, based on the input offset, one of the first and second amplifier output nodes into which a compensation current is to be coupled. The compensation current is based on a selected one of the PTAT current and CTAT current.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

Figure 1:
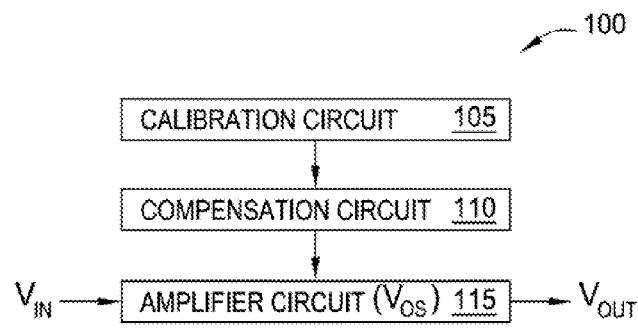
FIG. 1 is a block diagram illustrating a system configured to compensate input offset of an amplifier circuit, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or in the following detailed description.

According to various embodiments described herein, amplifier performance may be improved using a static compensation scheme for compensating input offset for an amplifier having first and second amplifier output nodes. A proportional-to-absolute temperature (PTAT) current generator is configured to generate a PTAT current within a predetermined temperature range, and a complementary-to-absolute-temperature (CTAT) current generator is configured to generate a CTAT current within the predetermined temperature range. A current selector is coupled with the first and second amplifier output nodes and is configured to couple, based on the input offset, a compensation current into a selected node of the first and second amplifier output nodes. The compensation current is based on a selected one of the PTAT current and CTAT current.

FIG. 1 is a block diagram illustrating a system configured to compensate input offset of an amplifier circuit, according to one embodiment. Within system 100, an amplifier circuit 115 is configured to receive an input voltage $v_{IN}$ and to produce an output voltage $v_{OUT}$. In some embodiments, the amplifier circuit 115 comprises an open-loop transconductance amplifier, though any suitable amplifier implementations are possible. The amplifier circuit 115 has an associated input offset voltage $v_{OS}$, effects of which are included in the output voltage $v_{OUT}$.

System 100 further comprises a compensation circuit 110 that is coupled with the amplifier circuit 115 and configured to provide a cancellation current into one or more amplifier output nodes of the amplifier circuit 115 in order to mitigate the effects of the input offset voltage $v_{OS}$. Traditional dynamic offset cancellation techniques, such as chopper stabilization, may be ill-suited for amplifier circuits 115 operating at high speeds (e.g., 1 GHz or greater) as these dynamic techniques often introduce distortion and/or jitter when switching events do not occur at a frequency much greater than the bandwidth of the amplifier circuit 115. Additionally, traditional offset cancellation techniques may exhibit a temperature dependence.

Various embodiments herein disclose a static offset cancellation scheme for high-speed amplifiers with temperature compensation. A static compensation circuit 110 provides a compensation current (also "cancellation current") to an amplifier output node, which can mitigate the effects of the input offset voltage $v_{OS}$ of the amplifier circuit 115 without suffering the same issues of bandwidth limitation. Additionally, the compensation circuit 110 is configured to adjust the compensation current based on changes to temperature, such that the input offset voltage $v_{OS}$ associated with the amplifier circuit 115 is mitigated across a desired temperature range.

System 100 further comprises a calibration circuit 105 that is configured to calibrate the compensation circuit 110. An exemplary calibration circuit 105 and method for calibrating a compensation circuit 110 is discussed below with respect to FIGS. 5 and 6. In some embodiments, the calibration circuit 105 selects a digital cancellation code that indicates the amount of the compensation current to be delivered to the amplifier circuit 115.

Figure 2:
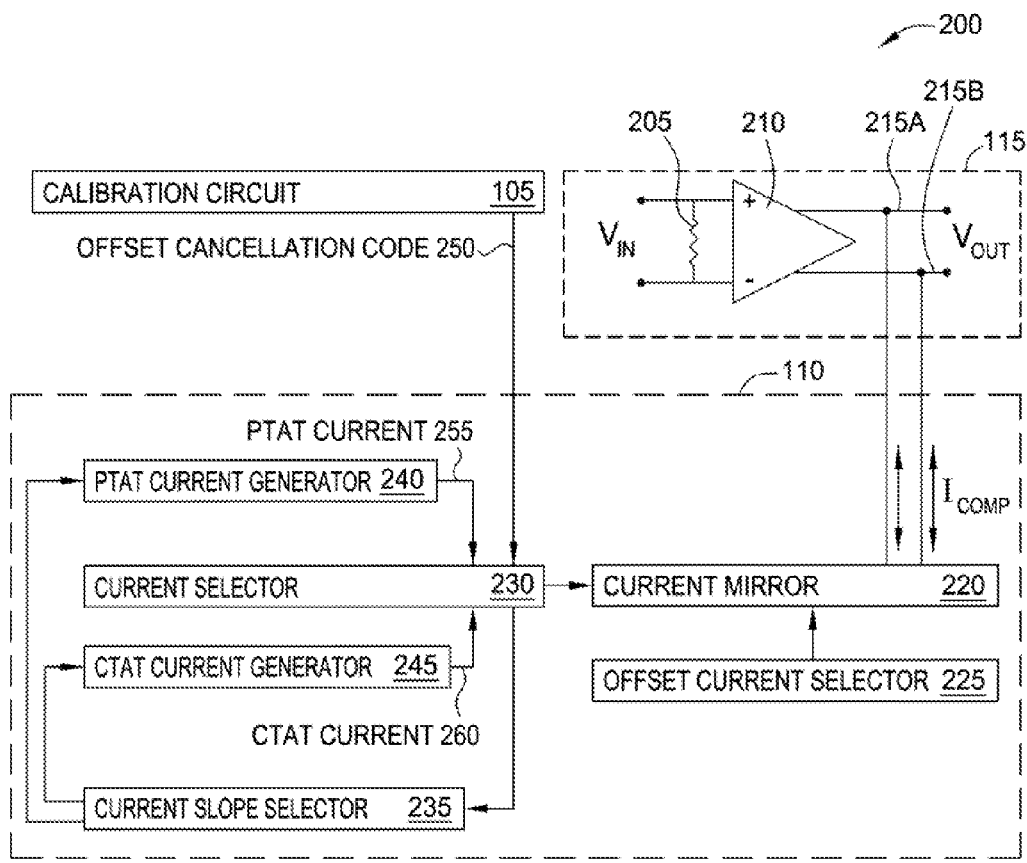
FIG. 2 is a block diagram illustrating an exemplary implementation of a compensation circuit, according to one embodiment.

FIG. 2 is a block diagram illustrating an exemplary implementation of a compensation circuit, according to one embodiment. Generally, arrangement 200 shows one possible implementation of the system 100 depicted in FIG. 1.

The amplifier circuit 115 includes at least one amplifier 210 having first and second amplifier output nodes 215A, 215B. As shown, amplifier 210 represents an open-loop transconductance amplifier, but the techniques discussed herein may be used with other types of amplifiers having an associated input offset voltage. The amplifier circuit 115 may further include other elements known to persons of ordinary skill in the art, such as a termination resistor 205 for impedance matching.

The compensation circuit 110 comprises a current selector 230 coupled with the first and second amplifier output nodes 215A, 215B and configured to couple a compensation current $I_{comp}$ into a selected node of the first and second amplifier output nodes 215A, 215B. The current selector 230 may comprise circuitry, firmware, software, or a combination thereof. As shown, current selector 230 is coupled with the first and second amplifier output nodes 215A, 215B through a current mirror 220. In some embodiments, the calibration circuit 105 provides an offset cancellation code 250 to the current selector 230 that is used to determine the amount of the compensation current $I_{comp}$.

The compensation circuit 110 further comprises a proportional-to-absolute-temperature (PTAT) current generator 240 configured to generate a PTAT current 255 within a predetermined temperature range, and a complementary-to-absolute-temperature (CTAT) current generator 245 configured to generate a CTAT current 260 within the predetermined temperature range. Within the predetermined temperature range, the PTAT current 255 and CTAT current 260 have similar minimum and maximum current values (corresponding to the lowest and highest temperatures of the predetermined temperature range) as well as similar temperature slopes.

A current slope selector 235 is coupled with the PTAT current generator 240 and CTAT current generator 245 and configured to select a temperature slope for each of these. The current slope selector 235 may comprise circuitry, firmware, software, or a combination thereof. In some embodiments, the PTAT current generator 240 and/or CTAT current generator 245 include adjustable resistors for adjusting the temperature slope of PTAT current 255 and/or CTAT current 260. The adjustable resistors can be programmed externally or adjusted (e.g., using signals provided by the current slope selector 235) based on the amount of compensation current $I_{comp}$ needed to cancel a given input offset voltage of the amplifier 210. The amplitude of temperature slope generally increases with increasing values of input offset voltage, so in some cases the current slope selector 235 changes the adjustable resistors linearly with changes in the required compensation current $I_{comp}$.

Figure 3:
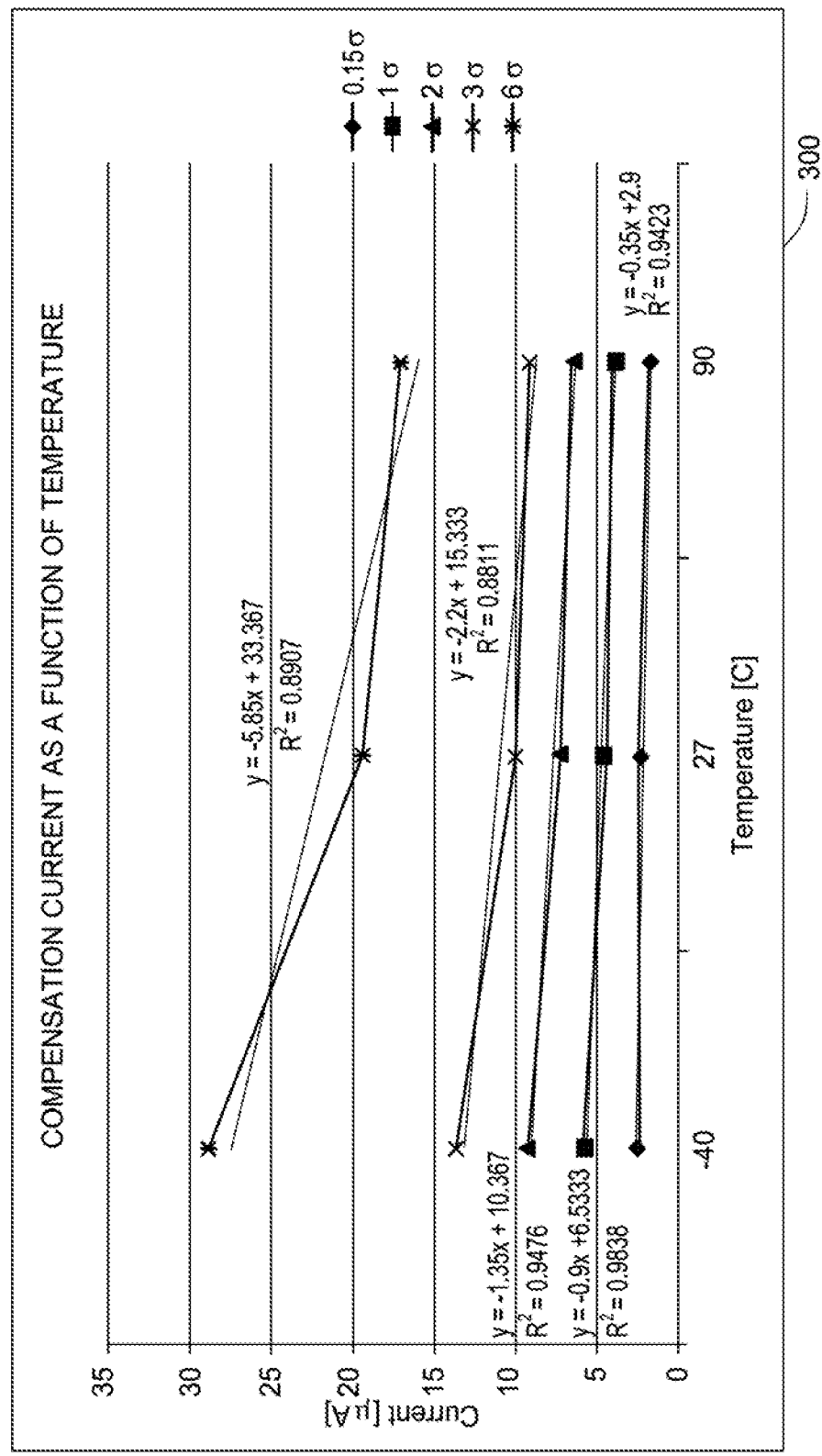
FIG. 3 is a graph illustrating compensation current as a function of temperature for a plurality of input offset value, according to one embodiment.

Based on the determined input offset voltage of the amplifier 210, the current selector 230 communicates with the current slope selector 235 to adjust a temperature slope of the PTAT current 255 and/or CTAT current 260. In turn, the selected temperature slope controls the amount of the compensation current $I_{comp}$ within the predetermined temperature range. Referring to FIG. 3, the graph 300 illustrates examples of compensation current $I_{comp}$ values as a function of temperature for a number of different input offset voltage values. Specifically, graph 300 includes plots corresponding to different standard deviations of the input offset voltage (i.e., $0.15\sigma$, $1\sigma$, $2\sigma$, $3\sigma$, and $6\sigma$). The example compensation current $I_{comp}$ values shown in graph 300 exhibit a CTAT behavior.

Returning to FIG. 2, after the input offset voltage for the amplifier 210 has been determined, the amount of the compensation current $I_{comp}$ can be determined using the selected temperature slope. The current selector 230 can further determine which node of the first and second amplifier output nodes 215A, 215B should receive the compensation current $I_{comp}$. And based on the selected node, the current selector 230 may further select one of the PTAT current 255 and CTAT current 260 to produce the compensation current $I_{comp}$. Selection between the PTAT current 255 and the CTAT current 260 depends on the slope of the offset voltage as temperature is changed. Whether current is injected into the first or second amplifier output node 215A, 215B is determined by whether the offset voltage is positive or negative.

The current selector 230 may control one or more switching devices (e.g., individual switches, a multiplexer, etc.) to direct the selected one of the PTAT current 255 and CTAT current 260 to the selected one of the first and second amplifier output nodes 215A, 215B.

After the current selector 230 selects which current of the PTAT current 255 and CTAT current 260 to use, the selected current is mirrored out to a number of devices of the current mirror 220 to produce the compensation current $I_{comp}$. The number of devices is controlled by offset current selector 225 and generally corresponds to the amount of accuracy required for the compensation circuitry 110. The offset current selector 225 may comprise circuitry, firmware, software, or a combination thereof. Thus, an offset cancellation code 250 can be used to determine the amount of compensation current $I_{comp}$ to compensate an input offset voltage. Since the current is mirrored from a selected one of a PTAT current generator 240 and CTAT current generator 245, the compensation current $I_{comp}$ will exhibit the necessary temperature dependence to provide accurate offset cancellation throughout the predetermined temperature range.

Although discussed primarily within the context of high-speed amplifier applications, the offset compensation techniques disclosed in various embodiments may be applied to other suitable amplifier architectures. For example, the static offset compensation techniques may be used anywhere offset is a concern and/or where using dynamic offset compensation techniques would introduce an unacceptable amount of noise or would be unreliable.

Technical Discussion of Offset Compensation

Typically, the three largest contributors to offset in an amplifier arise from variations in a device's threshold voltage $V_{TH}$, a current factor $\beta$, and a body-effect parameter $\gamma$. The variation in body-effect parameter $\gamma$ can generally be mitigated by tying the source of transistors of the amplifier (e.g., MOSFETs) to the body (bulk); consequently, this effect will not be addressed. To a first-order, the variation in threshold voltage $V_{TH}$ can be expressed as:

$$\sigma_{\Delta VTH} = \frac{A_{VTH}}{\sqrt{W \cdot L}}, \qquad (1)$$

where $A_{VTH}$ represents a constant determined by the semiconductor manufacturing process with units of millivolt-microns, W represents the channel width of the device in microns, and L represents the channel length of the device in microns. The $\sigma_{VTH}$ term represents one standard deviation of the offset voltage in millivolts.

The standard deviation of current factor $\beta$ can be expressed as:

$$\sigma_{\Delta\beta} = \beta \frac{A_\beta}{\sqrt{W \cdot L}}, \qquad (2)$$

where $A_\beta$ represents another constant determined by the semiconductor manufacturing process with units of microns. By observing the current equation for a MOSFET in strong-inversion, a total derivative can be applied to see the mismatch created between two devices. The equation for a MOSFET in strong-inversion is given as:

$$I_D = \frac{1}{2}\beta(V_{GS} - V_{TH})^2 \qquad (3)$$

Applying a total derivative to this equation yields:

$$\Delta I_D = \Delta\beta \frac{1}{2}(V_{GS} - V_{TH})^2 - \Delta V_{TH}\beta(V_{GS} - V_{TH}) + \Delta V_{GS}\beta(V_{GS} - V_{TH}) \qquad (4)$$

$$\therefore \frac{\Delta I_D}{I_D} = \frac{\Delta\beta}{\beta} + \frac{g_m}{I_D}\Delta V_{TH} \qquad (5)$$

This equation holds for devices operating in both strong and weak inversion, where $g_m$ is $\sqrt{2\beta I_D}$ in strong inversion and $$\frac{I_D}{\eta\varphi_t}$$

in weak inversion. Thus, the offset of a MOSFET has a clear temperature dependence in both weak and strong inversion regimes.

In open-loop amplifiers (typically used in high-speed receivers) having an open-loop transconductance amplifier (OTA) stage with gain, the input-referred offset voltage manifests itself as a current delta at the output node of the OTA. In an open-loop system, this current delta is amplified according to the open-loop gain of the OTA stage. As such, the output current difference is given by $$\Delta I_D = \frac{A_d V_{OS}}{R_{out}} = G_m V_{OS}, \qquad (6)$$

where $A_d$ represents the open-loop differential gain of the OTA, $R_{out}$ represents the output resistance of the OTA stage, and $G_m$ represents the transconductance of the OTA stage. Since many high-speed amplifier implementations include multiple low-gain, high-bandwidth stages, the output resistance tends to be relatively low, requiring a moderately large transconductance to compensate. However, since the amplifier is open-loop, the offset voltage is still amplified, even if by a small amount (e.g., typically in the 10-20 dB range). In one example, an input offset voltage of 5 mV, an OTA with a gain of 4 V/V (~12 dB), and an output resistance of 2 k$\Omega$, the current delta $\Delta I_D$=10 $\mu$A, which can be rather significant depending on the circuit's sensitivity.

Differentiating the current delta $\Delta I_D$ with respect to temperature yields:

$$\frac{\partial \Delta I_D}{\partial T} = \frac{\partial G_m}{\partial T}V_{OS} + \frac{\partial V_{OS}}{\partial T}G_m \qquad (7)$$

In simple amplifiers operating in strong inversion, $G_m$ represents the transconductance of the input pair, $\sqrt{2\beta I_D}$. Differentiating this quantity with respect to temperature yields:

$$\frac{\partial G_m}{\partial T} = \sqrt{\frac{I_D}{2\beta}} \frac{\partial \beta}{\partial T} + \sqrt{\frac{\beta}{2I_D}} \frac{\partial I_D}{\partial T} \quad (8)$$

This equation yields two approaches to guaranteeing an offset current temperature drift of 0 μA/° C. (to a first order). The first approach is to bias the amplifier with a current whose temperature coefficient follows the equation:

$$\frac{\partial I_D}{\partial T} = \frac{I_D}{\beta} \frac{\partial \beta}{\partial T} = I_D \frac{\beta_0}{\beta} \left(\frac{T}{T_{nom}}\right)^\alpha \quad (9)$$

This approach sets the derivative-with-respect-to-temperature of the transconductance equal to 0 which then sets $$\frac{\partial \Delta I_D}{\partial T} = 0.$$

Essentially, as long as the transconductance of the input transistors can be set such that the quantity does not vary with temperature, the value of $$\frac{\partial \Delta I_D}{\partial T}$$

will be only limited by the variation in offset voltage with temperature (which is acceptable since the transconductance variation dominates).

The second approach is to bias the amplifier with a zero temperature coefficient (ZTC) current such that the quantity $$\frac{\partial I_D}{\partial T} = 0.$$

This is commonly done in many sensitive designs and requires little overhead, since the ZTC references are normally used in multiple areas of a given IC. Doing so causes the offset current to follow the equation:

$$\frac{\partial \Delta I_D}{\partial T} = V_{OS}\left\{\frac{\alpha \beta_0}{T}\left(\frac{T}{T_{nom}}\right)^\alpha\right\} \sqrt{\frac{I_D}{2\beta_0\left(\frac{T}{T_{nom}}\right)^\alpha}} + \frac{\partial V_{OS}}{\partial T}\sqrt{2I_D\beta} \quad (10)$$

This allows for a current to be injected in the OTA output node with a temperature dependence equal to that of the equation above. Furthermore, this injected current can also handle variations in the offset voltage due to temperature. This current injection method is therefore more robust than the first method, but involves more overhead. To reiterate, these equations also assume that a ZTC current is available for biasing the amplifier. If such a current is not available, these equations increase in complexity but the current injection method will still be valid, so long as it can be calibrated. Another benefit from this method is that the offset voltage can be extrapolated from the injected cancellation current as long as the gain of the amplifier is known.

The same methods can be employed for devices in weak inversion with a slight change to the above equations. If the OTA is biased with a ZTC current, a current can be injected with a temperature coefficient equal to:

$$\frac{\partial \Delta I_D}{\partial T} = \frac{I_D}{\eta \varphi_t}\left[\frac{\partial V_{OS}}{\partial T} - \frac{V_{OS}}{T}\right] \quad (11)$$

However, the $$\frac{V_{OS}}{T}$$

term can De completely eliminated if the OTA is biased with a PTAT current of $$\frac{\varphi_t \ln(n)}{R},$$

which is typical of most PTAT current generation circuits.

Doing so (with the assumption that the temperature coefficient of the resistor is very small) yields a required temperature coefficient for the injected current of:

$$\frac{\partial \Delta I_D}{\partial T} = \frac{I_D}{\eta \varphi_t} \frac{\partial V_{OS}}{\partial T} \quad (12)$$

With sufficiently wide devices $$\left(\text{such that} \frac{\partial V_{OS}}{\partial T} \approx 0\right)$$

operating in weak inversion and biased with a PTAT current of $$\frac{\varphi_t \ln(n)}{R},$$

the offset variation over temperature becomes negligible.

As previously mentioned, if a compensation current is injected into the output branch of an OTA, the input offset voltage can be cancelled. If this compensation current $I_{comp}$ were to be subtracted from the current in either the positive or negative output node of the OTA, the current in said leg would be:

$$I_D = I'_D \pm \Delta I_D \mp I_{comp} \quad (13)$$

If the absolute value of the quantity $I_{comp}$ were to be set equal to the absolute value of the quantity $\Delta I_D$, $I_D = I'_D$ which cancels the effect of the input-referred offset voltage.

However, since $V_{OS}$ is an unknown and random quantity, $\Delta I_D$ is also unknown and random. Thus, a programmable $I_{comp}$ can be used to tune each offset cancellation circuit for the exact offset voltage of each amplifier. The resolution of this cancellation current is generally limited by the number of programmable bits.

As shown, there is a need for a temperature-dependent $I_{comp}$ in order to properly cancel the offset current. A voltage-controlled current sink is summed with the output nodes of an OTA stage (this can be in the form of a current sink or source: the orientation does not make a difference to this scheme). This sink can be summed with either the positive or negative node, whichever provides the most offset cancellation benefit (this will be determined by the value of the input-referred offset voltage). In order to generate a correct amount of current from the current sink, it is controlled by a system that adjusts the slope and/or absolute value of an input current reference. Since the offset cancellation method requires temperature dependence, two references can be generated: one that is proportional-to-absolute-temperature (PTAT) and one that is complementary-to-absolute-temperature (CTAT). PTAT and CTAT reference design is known within the semiconductor industry and beyond the scope of this disclosure. Any implementation of the PTAT and CTAT references is generally compatible with this offset cancellation scheme.

The PTAT and CTAT references, however, should be adjusted such that their absolute value and their slopes, with respect to temperature, match the requirements for $I_{comp}$ in a particular system. The design of slope adjustments and gain adjustments for PTAT and CTAT references is also known within the semiconductor industry.

Figure 4:
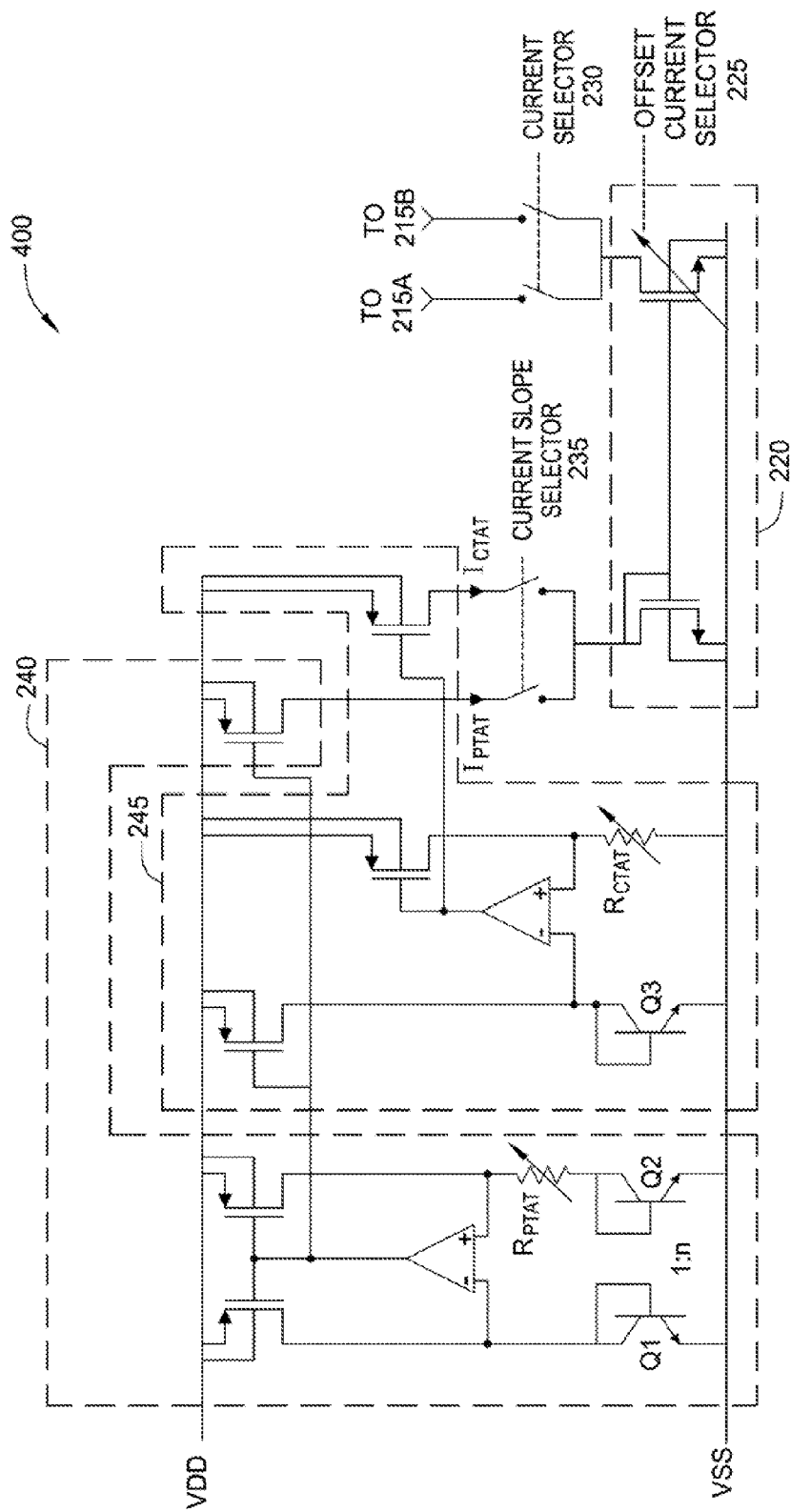
FIG. 4 is a circuit diagram illustrating an exemplary implementation of a compensation circuit, according to one embodiment.

FIG. 4 is a circuit diagram illustrating an exemplary implementation of a compensation circuit, according to one embodiment. Generally, compensation circuit 400 shows one possible implementation of the compensation circuit 110 depicted in FIG. 1.

Compensation circuit 400 includes a PTAT current generator 240 and CTAT current generator 245, as well as a current mirror 220. The PTAT current $I_{PTAT}$ is generated by dividing the difference in base-emitter voltages ($V_{BE}$) of bipolar junction transistors (BJTs) Q1 and Q2 by the adjustable resistor $R_{PTAT}$. The PTAT current $I_{PTAT}$ is mirrored into the collector of Q3 and the base-emitter voltage of Q3 is then placed across the adjustable resistor $R_{CTAT}$. The quantity $V_{BE,Q3}/R_{CTAT}$ is mirrored out to a 2:1 multiplexing circuit, as is the quantity $(V_{BE,Q1}-V_{BE,Q2}) R_{PTAT}$. Based on signals from the current slope selector 235, either $I_{PTAT}$ or $I_{CTAT}$ is mirrored into an adjustable n-type metal-oxide-semiconductor (NMOS) device. The adjustable NMOS device has an adjustable number K of fingers which allows for the absolute value of the compensation current to be modified according to $I_{out}=KI_{in}$. The adjustable NMOS device is controlled using signals from offset current selector 225. The generated compensation current is routed through a 2:1 multiplexing circuit that selects which amplifier output node 215A, 215B leg to sum the compensation current with.

The expressions for $I_{PTAT}$ and $I_{CTAT}$ are given below:

$$I_{PTAT} = \frac{1}{R_{PTAT}} \varphi_t \ln(n) \qquad (14)$$

$$I_{CTAT} = \frac{1}{R_{CTAT}} \varphi_t \ln\left(\frac{I_{PTAT}}{I_S}\right) \qquad (15)$$

This resistors can be set such that the currents are equal at room temperature:

$$R_{PTAT} = \frac{\varphi_t \ln(n)}{I_{nominal}} \qquad (16)$$

$$R_{CTAT} = \frac{V_{BE,nominal}}{I_{nominal}} \qquad (17)$$

As these equations illustrate, the values of $R_{PTAT}$ and $R_{CTAT}$ affect the absolute value of current. However, $R_{PTAT}$ and $R_{CTAT}$ can be used to adjust the temperature slope of each current $I_{PTAT}$ and $I_{CTAT}$. If some quantity 'y' has a linear relationship with another quantity 'x', an equation can be developed that says:

$$y=mx+b, \qquad (18)$$

where m represents the slope of y with respect to x and b is a scaling factor. In order to find what variables exist in m for the above $I_{PTAT}$ and $I_{CTAT}$ equations, the derivative with respect to temperature is taken. This derivative is equivalent to m:

$$\frac{\partial I_{PTAT}}{\partial T} = \frac{1}{R_{PTAT}} \frac{\varphi_t \ln(n)}{T} \qquad (19)$$

$$\frac{\partial I_{CTAT}}{\partial T} = \frac{1}{R_{CTAT}} \left\{ \frac{\varphi_t}{T} \ln\left(\frac{I_{PTAT}}{I_S}\right) - \frac{\varphi_t}{I_S} \frac{\partial I_S}{\partial T} + \frac{\varphi_t}{I_{PTAT}} \frac{\partial I_{PTAT}}{\partial T} \right\} \qquad (20)$$

$$\therefore \frac{\partial I_{CTAT}}{\partial T} = \frac{1}{R_{CTAT}} \frac{V_{BE,Q3} + \varphi_t(m-3) - \frac{E_g}{q}}{T} \qquad (21)$$

Thus $R_{PTAT}$ and $R_{CTAT}$ can be adjusted in order to modify the slope since the slope is the reciprocal of these resistances.

Figure 5:
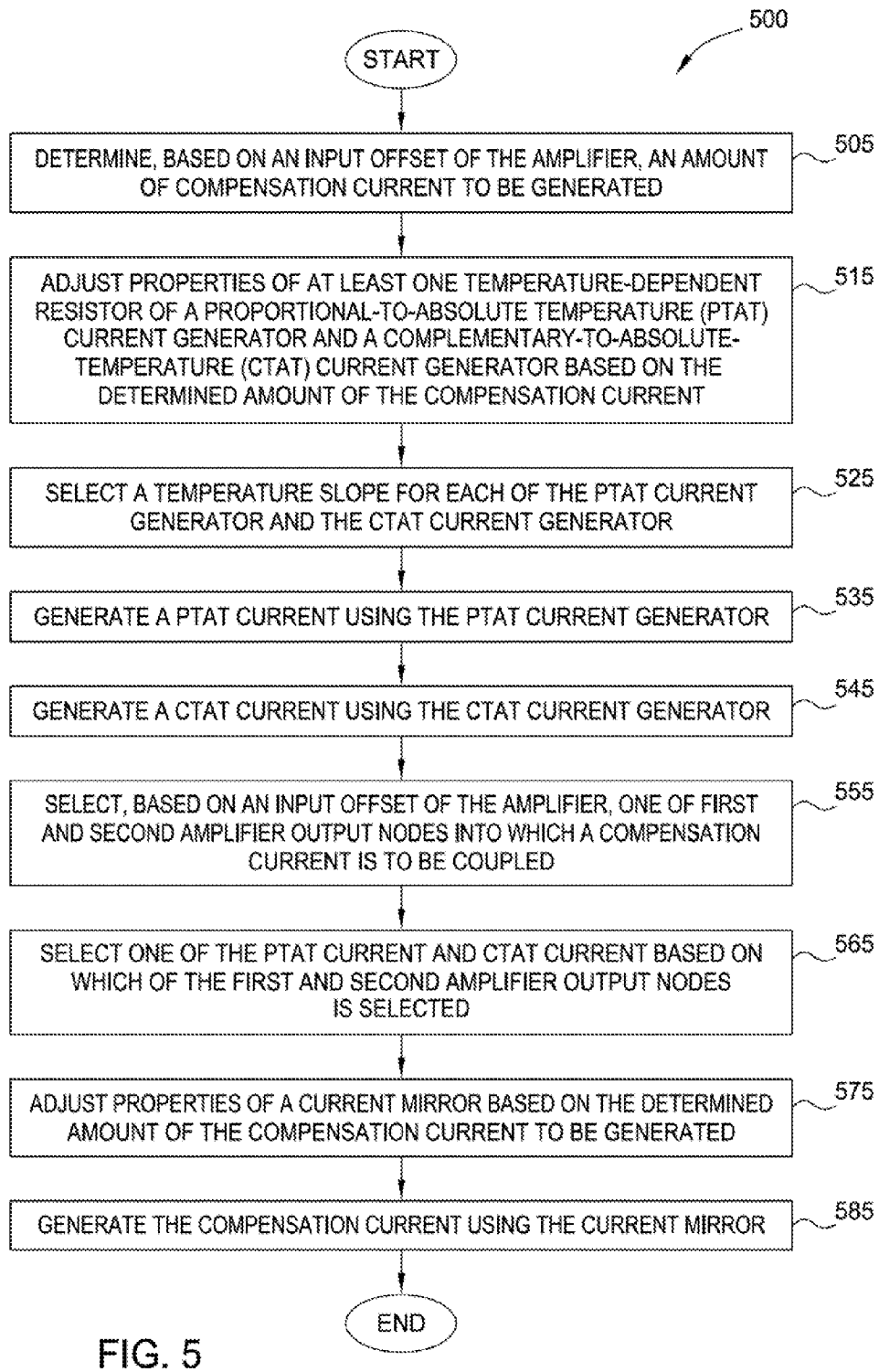
FIG. 5 is a method of compensating input offset of an amplifier, according to one embodiment.

FIG. 5 is a method of compensating input offset of an amplifier, according to one embodiment. Method 500 generally describes the operation of a compensation circuit such as compensation circuit 110 of FIGS. 1 and 2 and compensation circuit 400 of FIG. 4.

Method 500 begins at block 505, where the compensation circuit determines, based on an input offset of the amplifier, an amount of compensation current to be generated. At block 515, the compensation circuit adjusts properties of at least one temperature-dependent resistor of a PTAT current generator and a CTAT current generator based on the determined amount of the compensation current. At block 525, the compensation circuit selects a temperature slope for each of the PTAT current generator and the CTAT current generator.

At block 535, PTAT current generator generates a PTAT current according to the selected temperature slope. At block 545, the CTAT current generator generates a CTAT current according to the selected temperature slope.

At block 555, the compensation circuit selects one of the first and second amplifier output nodes into which a compensation current is to be coupled. At block 565, the compensation circuit selects one of the PTAT current and CTAT current based on which of the first and second amplifier output nodes is selected.

At block 575, the compensation circuit adjusts properties of a current mirror based on the determined amount of the compensation current to be generated. In some embodiments, adjusting properties of the current mirror comprises selecting a number of parallel devices used to produce the compensation current. At block 585, the compensation circuit generates the compensation current using the current mirror. Method 500 ends following block 585.

Figure 6:
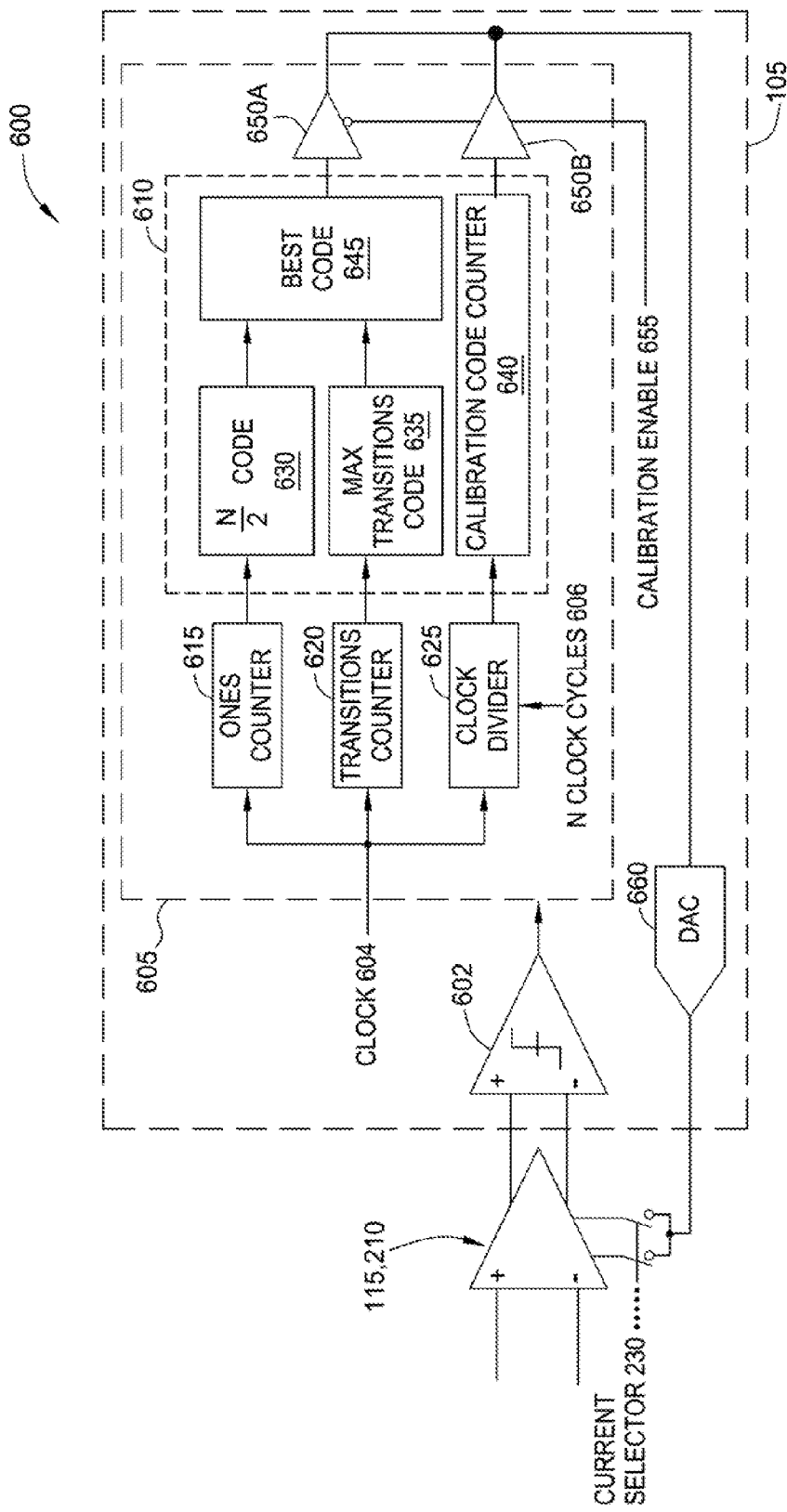
FIG. 6 is a block diagram illustrating an exemplary implementation of a calibration circuit, according to one embodiment.

FIG. 6 is a block diagram illustrating an exemplary implementation of a calibration circuit, according to one embodiment. Generally, arrangement 600 represents one possible implementation of the calibration circuit 105 depicted in FIG. 1. The arrangement 600 may be disposed on a single integrated circuit (IC) or arranged as separate circuitry (e.g., multiple ICs).

The calibration circuit 105 is coupled with amplifier 210 of amplifier circuit 115. Specifically, the amplifier output nodes 215A, 215B are coupled with respective inputs of a comparator 602. During the calibration process, a sequence of a plurality of calibration codes are sent through an digital-to-analog converter (DAC) 660 to a selected node of the amplifier 210, the selected node based on switching controlled by current selector 230. The comparator 602 produces an output signal based on the applied calibration code, which is assessed by code selection logic 605 to determine a best code to compensate the input offset voltage of the amplifier 210. A calibration enable signal 655 is applied to buffers 650A, 650B to select whether the code selection logic 605 operates in a calibration mode to determine the best code 645 or applies the determined best code 645 to the amplifier 210.

The code selection logic 605 includes a ones counter 615, a transitions counter 620, and a clock divider 625, each of which receive a clock signal 604. The clock divider further receives an input of N clock cycles 606, corresponding to the number of clock cycles (or samples of the output of amplifier 210) that each calibration code will be applied to the amplifier 210 during the calibration process. Generally, N may be selected based on the desired resolution for distinguishing the performance of the different calibration codes. The value of N may be selected to be as small as possible, consistent with the desired resolution, to reduce the number of clock cycles needed to perform the sweep across the different calibration codes during a calibration cycle. In some embodiments, the number N is selected as an odd number. One non-limiting example of an N value is twenty-five (25).

During the calibration process, each calibration code is applied to the amplifier 210 for a respective N clock cycles. A calibration code counter 640 increments based on a clock/N signal, selecting a next calibration code to apply for a subsequent N clock cycles 606.

During the application of each calibration code, the number of logic "1"s and the number of transitions on the signal generated by comparator 602 are counted. In some embodiments, the logic "1" and/or transitions are determined at each transition of the N clock cycles of clock signal 504.

In some embodiments, an equal number of logic "1"s and "0"s (in other words, the number of logic "1"s and/or logic "0"s is equal to N/2) indicates that the current calibration code is the best code 645 to compensate the particular input offset voltage. The equal number of logic "1"s and "0"s indicates that the output of the amplifier 210 is at a midpoint between the rail voltages, and the comparator 602, unable to determine whether the output from the amplifier 210 is high or low, oscillates between the two logic states.

Thus, a calibration code that results in a number of logic "1"s that is closer to N/2 than a previous best code 645 may become the new best code 645. In some embodiments, if during calibration, no calibration code corresponds to an equal (or substantially equal) probability of logic "1"s and "0"s, the calibration code that produces the number of logic "1"s closest to N/2 is chosen as the best code 645. At each clock/N transition, the value of the ones counter 615 for the currently applied calibration code is checked. If the value is closer to N/2 than the previous value, the current calibration code value is set as N/2 code 630 and/or the best code 645.

In cases where more than one calibration code corresponds to the greatest number of logic "1"s, the state machine 610 may further determine a maximum transitions code 635 (i.e., having a greater number of detected transitions) from the more than one calibration code, and set the maximum transitions code 635 as the best code 645.

The calibration process generally continues until each calibration code has been applied. In some embodiments, the calibration code counter 640 cycles through the calibration codes using gray code to minimize current spikes caused by switching events, and resets the ones counter 615 and transitions counter 620 for assessing the next calibration code. The best code 645 at the end of the calibration process may then be applied to the amplifier 210 to compensate for input offset during its operation.

The implementation of a calibration scheme is highly dependent on the circuit environment itself. The slope of the input offset over temperature should be similar and vary only with changes in process, therefore it is adequate to choose a temperature slope of the PTAT and/or CTAT current after wafer characterization in order to limit the complexity of the calibration routine. An alternative, not described in depth here, is to run the calibration routine at two, or more, temperatures with a default, and well-known, temperature slope. The two temperatures will yield two different calibration values which correspond to two different injected currents. The difference of these currents over the difference in the total temperature calibration range represents the ideal slope of the injected current. This value can be used to select the appropriate PTAT or CTAT slope setting.

Figure 7:
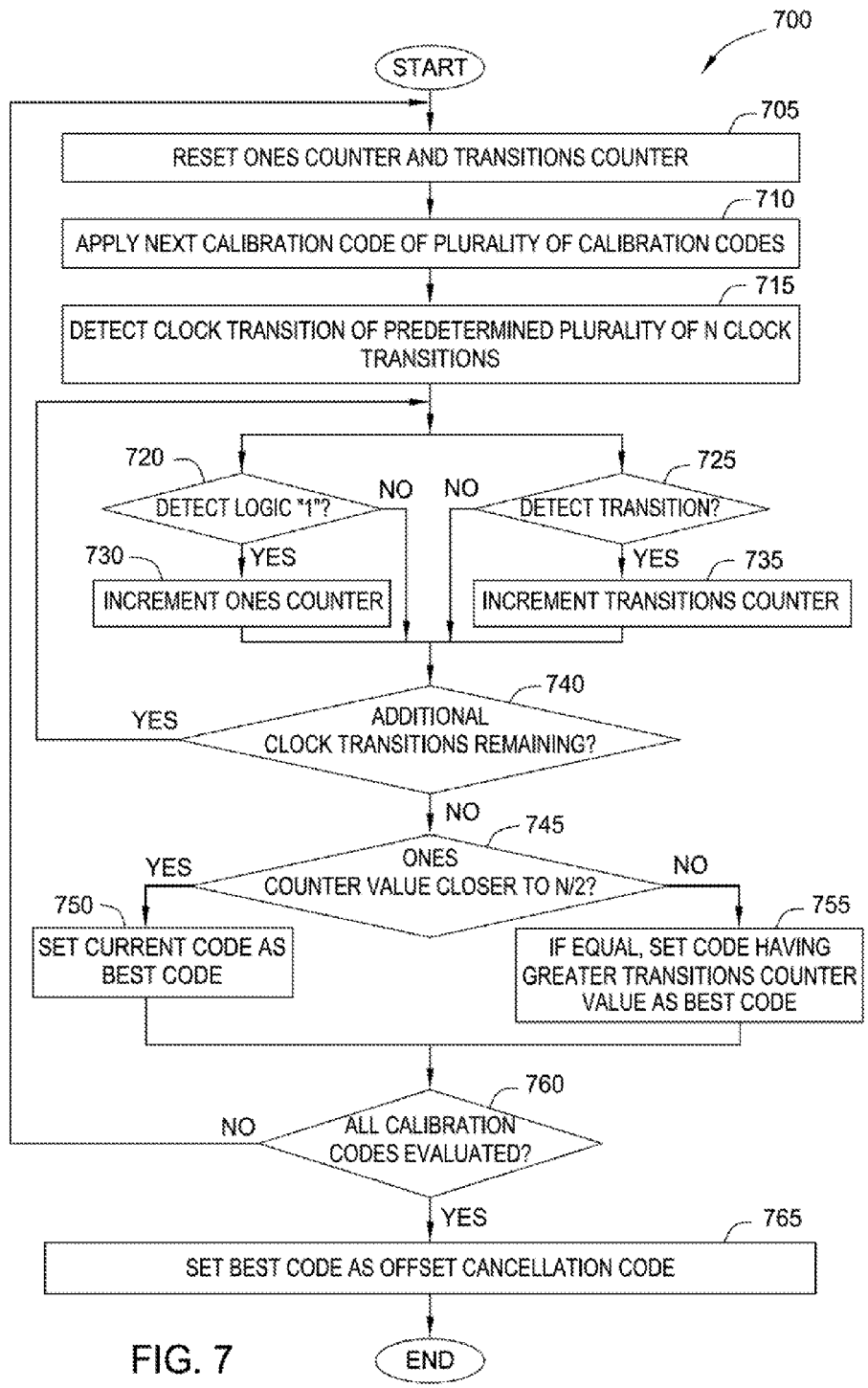
FIG. 7 is a method of calibrating a compensation circuit, according to one embodiment.

FIG. 7 is a method of calibrating a compensation circuit, according to one embodiment. Method 700 generally describes the operation of a calibration circuit such as calibration circuit 105 of FIGS. 1, 2, and 6.

Method 700 begins at block 705, where the calibration circuit resets a ones counter and a transitions counter. At block 710, the calibration circuit applies a next calibration code of a plurality of calibration codes. In some embodiments, the next calibration code comprises incrementing a calibration codes counter.

At block 715, the calibration circuit detects a clock transition of a predetermined plurality of N clock transitions. At block 720, the calibration circuit determines whether a logic "1" is detected responsive to the clock transition. If the logic "1" is detected (YES), the calibration circuit increments the ones counter at block 730 before proceeding. At block 625, the calibration circuit determines whether a transition occurred responsive to the clock transition. If the transition is detected (YES), the calibration circuit increments the transitions counter at block 735.

At block 740, the calibration circuit determines whether any additional clock transitions are remaining of the N clock transitions for the current calibration code. If additional clock transitions remain (YES), the method returns to block 715. If all N clock transitions have elapsed (NO), the method proceeds to block 745 to assess the relative performance of the calibration code.

At block 745, the calibration circuit determines whether the ones counter value for the currently applied calibration code is closer to an N/2 value than a current best calibration code. If no best code exists, such as a first time through the method 700, the currently applied calibration code may be set as the best code without performing analysis.

If the ones counter value is closer to an N/2 value (YES), the calibration circuit at block 750 sets the current calibration code as best code. If the ones counter value is not closer to the N/2 value (NO), the calibration circuit at block 755 determines whether ones counter value corresponding to the current calibration code is equal to the ones counter value for the best code. If equal, the calibration circuit sets the calibration code corresponding to a greater number of transitions as the best code.

If all calibration codes of the plurality of calibration codes have not been evaluated at block 760 (NO), the method returns to block 705. If all the calibration codes have been evaluated (YES), the method proceeds to block 765 and applies the offset cancellation code for compensating the input offset of the amplifier. Method 700 ends after completing block 765.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. An apparatus for compensating input offset for an amplifier having first and second amplifier output nodes, the apparatus comprising:
   a proportional-to-absolute temperature (PTAT) current generator configured to generate a PTAT current within a predetermined temperature range;
   a complementary-to-absolute-temperature (CTAT) current generator configured to generate a CTAT current within the predetermined temperature range; and
   a current selector coupled with the first and second amplifier output nodes and configured to couple, based on the input offset, a compensation current into a selected node of the first and second amplifier output nodes,
   the compensation current based on a selected one of the PTAT current and the CTAT current,
   wherein each of the PTAT current generator and the CTAT current generator comprises a respective temperature-dependent resistor, and
   wherein each temperature-dependent resistor is one of (a) externally programmable and (b) adjustable based on a determined amount of the compensation current needed to mitigate the input offset.

2. The apparatus of claim 1, wherein the current selector is configured to select the selected one of the PTAT current and CTAT current based on which of the first and second amplifier output nodes is the selected node.

3. An apparatus for compensating input offset for an amplifier having first and second amplifier output nodes, the apparatus comprising:
   a proportional-to-absolute temperature (PTAT) current generator configured to generate a PTAT current within a predetermined temperature range;
   a complementary-to-absolute-temperature (CTAT) current generator configured to generate a CTAT current within the predetermined temperature range;
   a current selector coupled with the first and second amplifier output nodes and configured to couple, based on the input offset, a compensation current into a selected node of the first and second amplifier output nodes, wherein the compensation current is based on a selected one of the PTAT current and the CTAT current; and
   a current slope selector coupled with the PTAT current generator and the CTAT current generator and configured to select a temperature slope for each of the PTAT current generator and the CTAT current generator.

4. An apparatus for compensating input offset for an amplifier having first and second amplifier output nodes, the apparatus comprising:
   a proportional-to-absolute temperature (PTAT) current generator configured to generate a PTAT current within a predetermined temperature range;
   a complementary-to-absolute-temperature (CTAT) current generator configured to generate a CTAT current within the predetermined temperature range;
   a current selector coupled with the first and second amplifier output nodes and configured to couple, based on the input offset, a compensation current into a selected node of the first and second amplifier output nodes, wherein the compensation current is based on a selected one of the PTAT current and the CTAT current; and
   a current mirror coupled with the output of the current selector, the current mirror configured to generate the compensation current based on the selected one of the PTAT current and the CTAT current.

5. The apparatus of claim 4, wherein the current mirror is adjustable, the apparatus further comprising:
   an offset current selector configured to:
   determine, based on the input offset, an amount of the compensation current; and
   adjust properties of the current mirror based on the amount of the compensation current to be generated.

6. A system, comprising:
   an amplifier circuit comprising at least one amplifier having first and second amplifier output nodes; and
   a compensation circuit configured to compensate an input offset of the at least one amplifier, the compensation circuit comprising:
   a proportional-to-absolute temperature (PTAT) current generator configured to generate a PTAT current within a predetermined temperature range;
   a complementary-to-absolute-temperature (CTAT) current generator configured to generate a CTAT current within the predetermined temperature range; and
   a current selector coupled with the first and second amplifier output nodes and configured to couple, based on the input offset, a compensation current into a selected node of the first and second amplifier output nodes,
   the compensation current based on a selected one of the PTAT current and CTAT current,
   wherein each of the PTAT current generator and the CTAT current generator comprises a respective temperature-dependent resistor, and
   wherein each temperature-dependent resistor is one of (a) externally programmable and (b) adjustable based on a determined amount of the compensation current needed to mitigate the input offset.

7. The system of claim 6, wherein the current selector is configured to select the selected one of the PTAT current and CTAT current based on which of the first and second amplifier output nodes is the selected node.

8. A system comprising:
   an amplifier circuit comprising at least one amplifier having first and second amplifier output nodes; and
   a compensation circuit configured to compensate an input offset of the at least one amplifier, the compensation circuit comprising:

a proportional-to-absolute temperature (PTAT) current generator configured to generate a PTAT current within a predetermined temperature range;

a complementary-to-absolute-temperature (CTAT) current generator configured to generate a CTAT current within the predetermined temperature range;

a current selector coupled with the first and second amplifier output nodes and configured to couple, based on the input offset, a compensation current into a selected node of the first and second amplifier output nodes, wherein the compensation current is based on a selected one of the PTAT current and CTAT current; and a current slope selector coupled with the PTAT current generator and the CTAT current generator and configured to select a temperature slope for each of the PTAT current generator and the CTAT current generator.

9. A system comprising:

an amplifier circuit comprising at least one amplifier having first and second amplifier output nodes; and a compensation circuit configured to compensate an input offset of the at least one amplifier, the compensation circuit comprising:

a proportional-to-absolute temperature (PTAT) current generator configured to generate a PTAT current within a predetermined temperature range;

a complementary-to-absolute-temperature (CTAT) current generator configured to generate a CTAT current within the predetermined temperature range;

a current selector coupled with the first and second amplifier output nodes and configured to couple, based on the input offset, a compensation current into a selected node of the first and second amplifier output nodes, wherein the compensation current is based on a selected one of the PTAT current and CTAT current; and a current mirror coupled with the output of the current selector, the current mirror configured to generate the compensation current based on the selected one of the PTAT current and the CTAT current.

10. The system of claim 9, wherein the current mirror is adjustable, the compensation circuit further comprises:

an offset current selector configured to:

determine, based on the input offset, an amount of the compensation current; and adjust properties of the current mirror based on the amount of the compensation current to be generated.

11. A method for compensating input offset of an amplifier having first and second amplifier output nodes, the method comprising:

generating, using a proportional-to-absolute temperature (PTAT) current generator, a PTAT current;

generating, using a complementary-to-absolute temperature (CTAT) current generator, a CTAT current, wherein each of the PTAT current generator and the CTAT current generator comprises a respective temperature-dependent resistor;

determining, based on the input offset, an amount of the compensation current;

adjusting properties of at least one temperature-dependent resistor based on the amount of the compensation current; and selecting, based on the input offset, one of the first and second amplifier output nodes into which the compensation current is to be coupled, wherein the compensation current is based on a selected one of the PTAT current and CTAT current, the method further comprising:

selecting the selected one of the PTAT current and CTAT current based on which of the first and second amplifier output nodes is selected.

12. A method for compensating input offset of an amplifier having first and second amplifier output nodes, the method comprising:

generating, using a proportional-to-absolute temperature (PTAT) current generator, a PTAT current;

generating, using a complementary-to-absolute temperature (CTAT) current generator, a CTAT current;

selecting, for each of the PTAT current generator and the CTAT current generator, a temperature slope, wherein generating the PTAT current and generating the CTAT current are based on the selected temperature slope; and selecting, based on the input offset, one of the first and second amplifier output nodes into which a compensation current is to be coupled, wherein the compensation current is based on a selected one of the PTAT current and the CTAT current.

13. A method for compensating input offset of an amplifier having first and second amplifier output nodes, the method comprising:

generating, using a proportional-to-absolute temperature (PTAT) current generator, a PTAT current;

generating, using a complementary-to-absolute temperature (CTAT) current generator, a CTAT current;

selecting, based on the input offset, one of the first and second amplifier output nodes into which a compensation current is to be coupled; and generating the compensation current using a current mirror, wherein the compensation current is based on a selected one of the PTAT current and CTAT current.

14. The method of claim 13, wherein the current mirror is adjustable, the method further comprising:

determining, based on the input offset, an amount of the compensation current; and adjusting properties of the current mirror based on the determined amount of the compensation current to be generated.

* * * * *